United States Patent
Betts et al.

Patent Number: 5,311,557
Date of Patent: May 10, 1994

[54] CIRCULAR LIMITER FOR USE IN A RECEIVER TO REDUCE THE EFFECTS OF SIGNAL DISTORTION

[75] Inventors: William L. Betts, St. Petersburg; Keith A. Souders, Tampa, both of Fla.

[73] Assignee: AT&T Bell Laboratories, Murray Hill, N.J.

[21] Appl. No.: 916,059

[22] Filed: Jul. 10, 1992

[51] Int. Cl.$^5$ ............................................. H04L 27/06
[52] U.S. Cl. ........................................ 375/94; 375/99
[58] Field of Search ..................... 375/94, 39, 99, 78, 375/83, 85, 58, 80; 329/304; 371/43

[56] References Cited

U.S. PATENT DOCUMENTS

| | | | |
|---|---|---|---|
| 4,439,863 | 3/1984 | Bellamy | 375/39 |
| 4,503,545 | 3/1985 | Bremer et al. | 375/39 |

*Primary Examiner*—Stephen Chin
*Assistant Examiner*—Hai H. Phan
*Attorney, Agent, or Firm*—Joseph J. Opalach

[57] ABSTRACT

The effect of non-linear distortion on a received signal point is reduced by the use of a circular limiter. In particular, the circular limiter computes the distance of the received signal point from the center of the signal point constellation. If this distance exceeds a desired limit, then both dimensions of the received signal point are reduced by the same factor to maintain the original phase. This reduction in the dimensions of the received signal point decreases the corresponding error signal that is calculated by a Viterbi decoder. As a result, this further reduces the value of the accumulated path metrics of the Viterbi decoder which results in an improvement in system performance. In addition, the circular limiter also realizes a slight improvement in system performance against additive white Gaussian noise. The value of the limiting distance can either be predefined, or determined adaptively to match channel conditions of the communications system.

23 Claims, 2 Drawing Sheets

CONSTELLATION OF SIGNAL POINTS

CIRCULAR LIMITER FOR USE IN A RECEIVER TO REDUCE THE EFFECTS OF SIGNAL DISTORTION

BACKGROUND OF THE INVENTION

The present invention relates to data communications systems, particularly the transmission of data over voiceband telephone channels using modems.

Today, information and data services are provided to both the business and residential sectors through the use of modems in the telephone network. Over the years, the amount of information and the complexity of data services has increased and, as a result, modem speeds have also increased. For example, currently, modem speeds over the telephone network are as high as 28.8 kilobit per second. Indeed, continued growth in information and data services will require that modem speeds continue to increase.

However, in order to support high speeds, a modem uses a dense constellation of signal points to transmit data through the telephone network from a transmitting modem to a receiving modem. Unfortunately, any telecommunications system (like the transmitting modem, telephone network and the receiving modem) introduces distortion that is proportional to the transmitted signal level. Sources of such distortion include quantization noise, adaptive differential pulse code modulation, and inter-modulation distortion. This amount of distortion is proportional to the transmitted signal power, which itself is proportional to the distance of a signal point from the center of the signal point constellation. In other words, the signal points that are further away from the origin of the constellation, i.e., that have more transmitted signal power, are the most affected by any distortion when finally received by the receiving modem. Consequently, the amount of distortion that can be tolerated in a communications system may limit the data rate, or speed, of the system.

In order to reduce the effect of distortion on transmitted data signals, those in the art have designed, with particularity, the transmitter and receiver components of the communications system. For example, the co-pending, commonly assigned, United States patent application of W. Betts et al. entitled "Non-linear Encoder and Decoder for Information Transmission Through Non-linear Channels," Ser. No. 07/754,107, filed on Sept. 3, 1991, discloses a technique for changing the shape of the transmitted signal point constellation prior to transmission of any signal point to a receiving modem. In particular, the transmitted signal point constellation is "warped" inversely to the expected distortion. As a result, the receiving modem must compensate for the altered shape of the signal point constellation in processing any received signal point. Since the transmitter and receiver are, in a sense, "matched," the effect of distortion on a transmitted data signal is reduced.

SUMMARY OF THE INVENTION

In accordance with the invention, it is possible to reduce the effects of distortion without matching the characteristics of the transmitter and the receiver. In particular, the effects of the above-mentioned distortion on the outer signal points of a signal point constellation in a high-speed communications system can be reduced by limiting, in a receiving modem, the received signal points to a portion of the signal space. This reduces the effects of any distortion and, consequently, improves performance of the system.

In an embodiment of the invention, a "circular limiter" computes the distance of the received signal point from the center of the signal point constellation. If this distance exceeds a desired limit, which is the radius of the circular limiter, then both dimensions of the received signal point are reduced by an identical factor to maintain the original phase. This reduction in the dimensions of the received signal point decreases the corresponding error signal that is calculated by a Viterbi decoder. As a result, this further reduces the value of the accumulated path metrics of the Viterbi decoder which results in an improvement in system performance. In addition, the circular limiter also realizes a slight improvement in performance against additive white Gaussian noise. The value of the radius can be either predefined or adaptively determined to match the channel conditions of a communications system.

Since this invention only affects the receiver portion of a modem, the invention can be advantageously used to improve the performance of any standard modem, like a CCITT V.32 bis modem, without loss of compatibility to other modems in the communications system.

DETAILED DESCRIPTION

Figure 1:
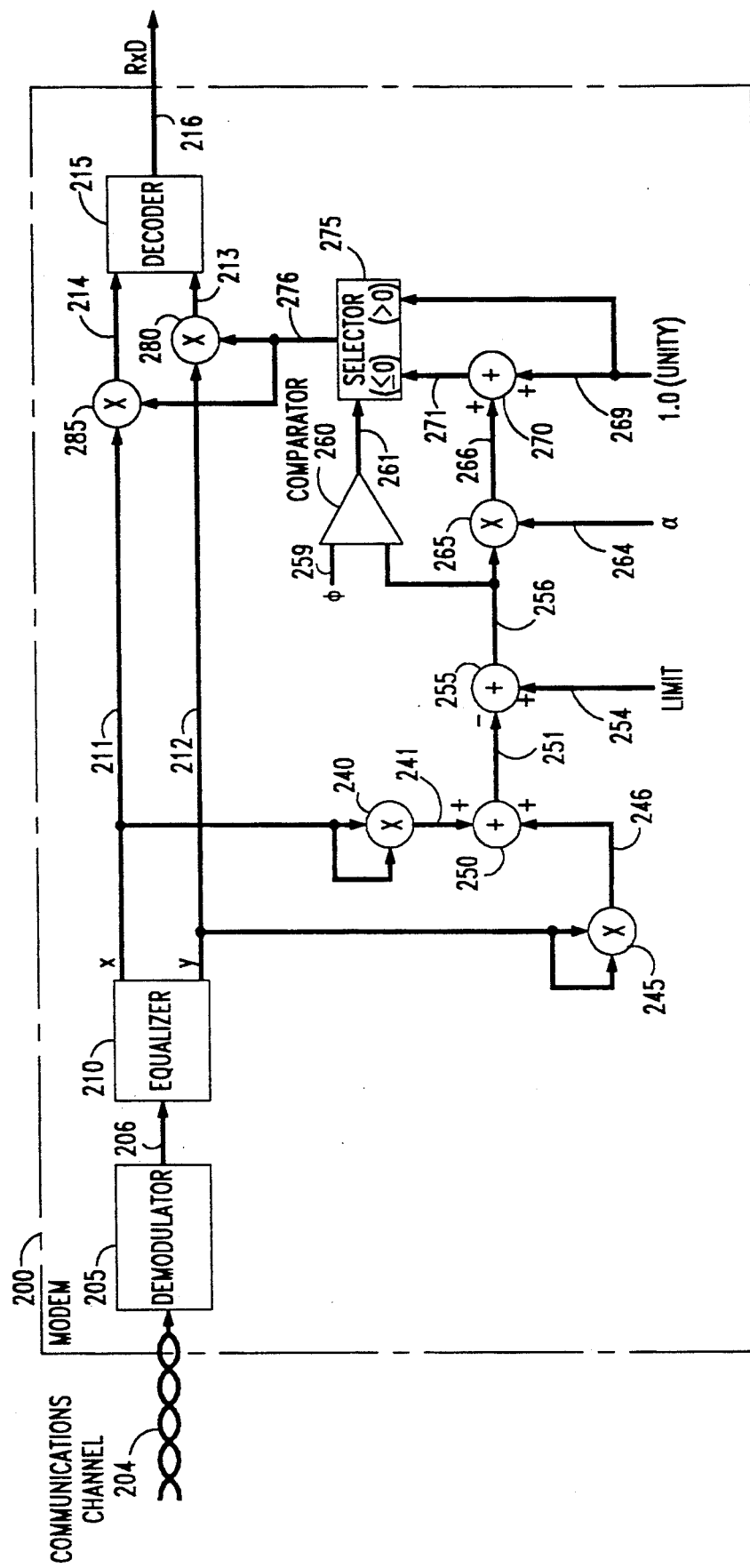
FIG. 1 is a block diagram of a modem embodying the principles of the invention.

Modem 200, of FIG. 1, receives a signal with multiple amplitude modulation, e.g., quadrature amplitude modulation, from a communications channel (not shown) on twisted pair 204. The signal on twisted pair 204 is applied to demodulator 205, which is representative of conventional reception and demodulation circuitry, e.g., demodulation, phase/jitter tracking, analog-to-digital conversion, etc. Demodulator 205 provides an input signal to equalizer 210 on lead 206. As is known in the art, equalizer 210 equalizes the signal to compensate for the effects of intersymbol interference and provides a stream of received signal points, or symbols. In particular, each received signal point is two-dimensional and is represented by its "x-coordinate" and "y-coordinate" values in the signal space. These x-coordinate and y-coordinate values, for each signal point, are provided by representative signals on leads 211 and 212, respectively. The x-coordinate and y-coordinate values may also be referred to as the respective "real" and "imaginary" components of the received signal point.

Figure 2:
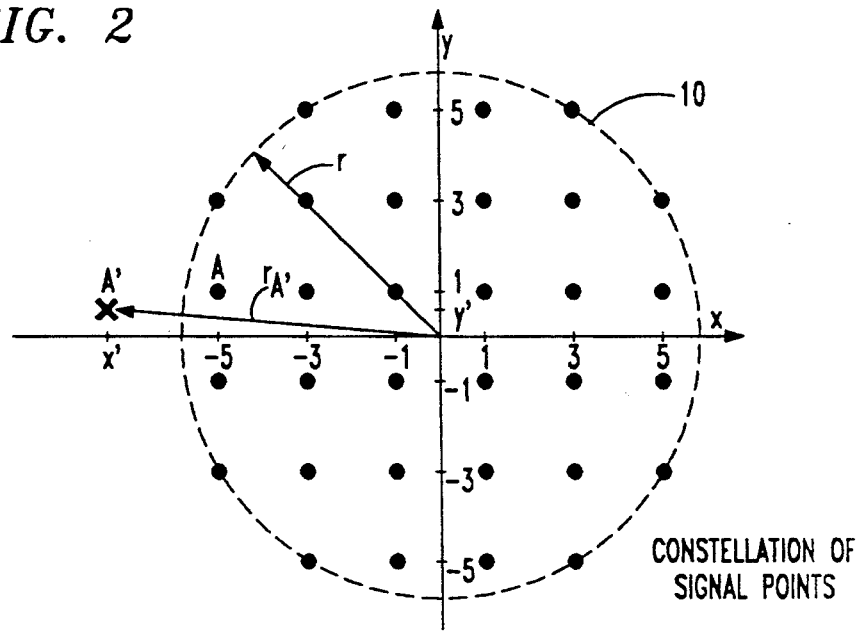
FIG. 2 is an illustrative signal point constellation used in the modem of FIG. 1.

The signal space is defined by the signal point constellation that is used by the transmitting modem. For this example, a sample signal point constellation is shown in FIG. 2 and represents the set of possible signal points transmitted by another modem to modem 200, i.e., the signal space. Unfortunately, as noted above, the transmitted signal points are subject to distortion from the communications channel, like inter-modulation distortion. Consequently, for any one particular transmitted signal point, the corresponding received signal point provided by equalizer 210 may have different x and y coordinates than the signal point that was transmitted. For example, as shown in FIG. 2, assume that signal point A is transmitted by another modem to receiving modem 200. When the signal is received by modem 200, equalizer 210 provides received signal point A', which is different from transmitted signal point A because of the distortion effects of the communications channel. In fact, as mentioned above, the distance the transmitted signal point is away from the origin of the signal point constellation is directly related to the transmitted power of the signal point. This distance, or transmitted power, also proportionally increases the effects of distortion on the transmitted signal point—with the result that the further the transmitted signal point is from the origin, the more the communications channel may distort the transmitted signal point.

Therefore, in accordance with the invention, the effects of distortion are reduced by the use of a circular limiter that limits the perimeter of a received signal point constellation. In other words, the signal space is modified, or limited, to be confined to a circle with a radius r. This is shown in FIG. 2, where circle 10, with radius r, defines the modified signal space. Any received signal point that is outside of circle 10 is processed so that its location is moved closer to, if not within, circle 10. In particular, the coordinates of each received signal point are compared to the radius r. If the received signal point falls outside circle 10, the location of the received signal point is proportionally reduced by a factor, which moves, or translates, the received signal point towards the origin of the signal space while maintaining the original phase of the received signal point. However, if the coordinates of the received signal point are within circle 10 there is no need to change the location of the received signal point.

The translation of any received signal points outside of circle 10 results in an improvement in performance of modem 200. In particular, for the received signal point A', a Viterbi decoder of modem 200 calculates a number of error metrics. Each error metric is representative of the amount of error between the received signal point and each possible transmitted signal point. For example, one of the error metrics is the magnitude of the error vector from signal point A to received signal point A', of FIG. 2. The Viterbi decoder adds these various error metrics to a set of accumulated path metrics, each path metric representing an estimate of an actual transmitted signal point sequence. It can be observed that the further received signal point A' is away from the origin and the outer signal points of the constellation, the more the resultant error metrics are skewed, or biased, thereby introducing more error into the estimation of the transmitted signal point sequence. However, and in accordance with the invention, as shown in FIG. 2, the signal space is limited, e.g., it has a clear perimeter as represented by circle 10. Since received signal point A' is already outside of this limited signal space, the received signal point A' can be moved closer to the perimeter of circle 10. This translation of the received signal point maintains the phase of the received signal point so that no additional error is introduced into the system. In fact, the translation of the received signal point reduces the resultant error vector and allows a more accurate conclusion by any subsequent Viterbi decoder. This leads to a concomitant increase in system performance in the presence of distortion. In addition, the circular limiter also realizes a slight improvement in performance against additive white Gaussian noise.

As shown in FIG. 1, the output signals of equalizer 210, which are representative of the x and y coordinate values of a particular received signal point, are applied to respective multipliers 240 and 245. Each multiplier squares the value of the input signal, that is, the output of multiplier 240 is a signal representative of $x^2$ and the output of multiplier 245 is a signal representative of $y^2$. The output of these two multipliers is then added together by adder 250 to provide a signal representative of a sum, equal to $x^2+y^2$, on lead 251. It should be observed that this sum merely represents the square of the magnitude of a vector that is drawn from the origin of the signal point constellation to the location of the received signal point in the signal space.

The sum, as represented by the signal on lead 251, is applied to adder 255, which subtracts this sum from a number, represented by the signal "LIMIT" in FIG. 1 on lead 254. In the context of FIG. 2, the number, represented by the signal LIMIT, is the value of the square of the radius of circle 10, i.e., $r^2$. As a result, the output signal of adder 255 is a difference signal that is representative of the difference between the location of the received signal point and the modified signal space. This difference is equal to $r^2-x^2-y^2$. From FIG. 2, the value for $r^2$ is 34. The difference signal is provided, via lead 256, to comparator 260 and multiplier 265. Comparator 260 compares the value of the difference signal on lead 256 to a reference signal on lead 259. The reference signal represents a value of zero. The output lead, 261, of comparator 260, provides a signal representative of whether or not the above-mentioned difference, i.e., $r^2-x^2-y^2$, is greater than zero.

Multiplier 265, which also receives the difference signal from lead 256, provides the product of the difference signal and signal $\alpha$, which is provided via lead 264. In this particular example, the value represented by signal $\alpha$ is equal to $1/(3r^2)=0.01$ for a data speed of 9600 bits per second in an AT&T 3800 V.32 modem using the constellation of FIG. 2. The product from multiplier 265 is provided on lead 266 to adder 270. The value of this product is equal to:

$$(r^2-x^2-y^2)\alpha. \qquad (1)$$

Adder 270 increases the value of the product shown in equation (1) by one, i.e., unity. As a result, the output signal from adder 270 is representative of a "scaling factor" that is equal to:

$$1+(r^2-x^2-y^2)\alpha. \qquad (2)$$

Adder 270 applies its output signal, on lead 271, to selector 275, which also receives another signal via lead 269. The signal on lead 269 is representative of another scaling factor that is equal to unity. The output signal from comparator 260, discussed above, controls the output signal of selector 275. In particular, selector 275 provides a scaling factor on lead 276 that is dependent upon whether or not the received signal point exceeds the desired limit. This scaling factor is equal to:

$$1+(r^2-x^2-y^2)\alpha, \text{ when } r^2-x^2-y^2 \leq 0, \text{ and}$$
$$1, \text{ when } r^2-x^2-y^2 > 0.$$

Selector 275 provides the selected scaling factor to multipliers 280 and 285. Multiplier 285 provides the product of the selected scaling factor and the x coordinate, provided by equalizer 210, to decoder 215. Multiplier 280 provides the product of the selected scaling factor and the y coordinate, provided by equalizer 210, to decoder 215. Consequently, as can be seen, when the value of the difference signal is less than, or equal to zero, the received signal point provided by equalizer 210 is proportionally reduced in both the x and y dimensions. This reduces the radius of the received signal point to approximately the radius, r, of the modified signal space while maintaining the original phase of the received signal point. In effect, the circular limiter limits a two-dimensional signal constellation to a predefined circular shape. On the other hand, when the value of the difference signal is greater than zero, the coordinates of the received signal point provided by equalizer 210 are not affected since the coordinates are multiplied by unity. Decoder 215 includes conventional circuitry, like a slicer, Viterbi decoder, etc. to provide a signal representative of the received data stream on lead 216.

Figure 3:
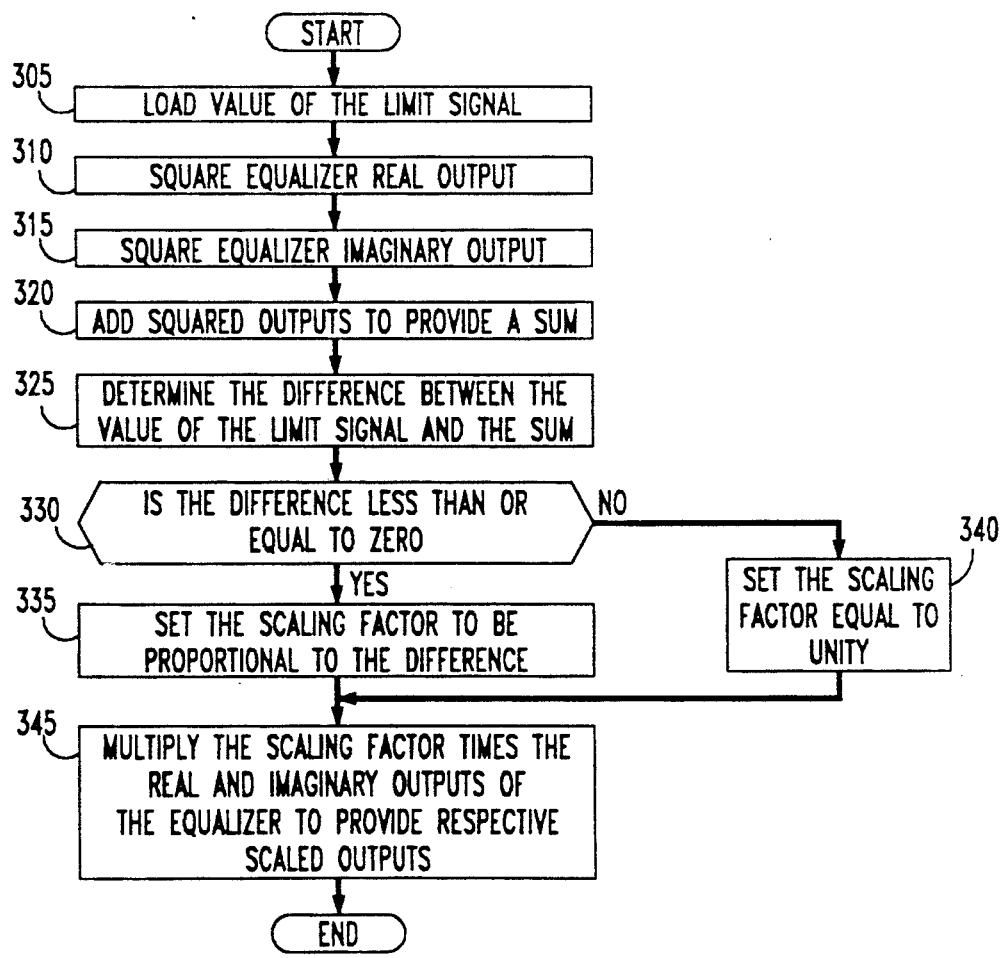
FIG. 3 is a flow diagram of a method used in the modem of FIG. 1.

The flow diagram shown in FIG. 3 is a method representing the inventive concept described above. In block 305, the value of the constellation dependent limit signal, $r^2$, is loaded. The equalizer's real output, i.e., the x coordinate, is squared in block 310 and the equalizer's imaginary output, i.e., the y coordinate, is squared in block 315. The squared outputs are then added together in block 320 to provide a sum. The difference between the value of the LIMIT signal and this sum is determined in block 325. At this point, which scaling factor to use will be determined by block 330. If the difference is less than or equal to zero, the value of the scaling factor is proportional to the difference, which is determined in block 335. In particular, as shown in equation (2), the scaling factor is:

$$1+(r^2-x^2-y^2)\alpha.$$

On the other hand, if the difference is greater than zero, the scaling factor is set equal to unity in block 340.

The chosen scaling factor is then multiplied times the real equalizer output and the imaginary equalizer output in block 345 to provide scaled outputs of the real and imaginary components. These scaled outputs, as described above, are then applied to a decoder.

It should be noted that the above method of scaling the received signal point moves it, in a simple fashion, towards a position that is approximately near the perimeter of circle 10. However, other equations can also be used to determine a scaling factor, that although more complex, would move the received signal point directly to the perimeter of the modified signal space. For example, the following equation can also be used:

$$r/r_A' = r/\sqrt{x^2+y^2}, \quad (3)$$

where $r'_A$ is the magnitude of the vector from the origin of the signal space to received signal point A' as shown in FIG. 2.

Also, the value of $\alpha$ can be modified if more distortion is expected in the system. The value of $\alpha$ disclosed above is useful for deviations in the received signal points as high as 2.25 dB. If higher deviations in the received signal points are expected then either the value of $\alpha$ can be changed or the radius of circle 10 can be increased. For example, if signal peaks of 4 dB were expected, the value of $\alpha$ can be changed to: $1/(4r^2)$.

The foregoing merely illustrates the principles of the invention and it will thus be appreciated that those skilled in the art will be able to devise numerous alternative arrangements which, although not explicitly described herein, embody the principles of the invention and are within its spirit and scope.

For example, besides a circular shape, other shapes, like squares, octagons, or polygons that are created by connecting the outer perimeter signal points of a constellation, can be applied to different types of constellations, in order to define the relevant portion of the signal space, i.e., the modified signal space. In fact the outer points of any signal point constellation can be used to define the particular shape. It should be noted that not using a circular shape may increase the complexity of any translation algorithm. Also, in regards to the translation algorithm, an iterative approach is also possible. In particular, received signal points outside of the relevant portion of the signal space can be iteratively reduced by a set factor until the received signal point has been moved to the modified signal space.

In addition, this invention can be applied to the receiving circuitry of any modem in which a sequence of N-dimensional signal points are received. The signal points can be from a uniformly spaced constellation as shown in FIG. 2, or a non-linear constellation, which is described in the above-mentioned co-pending patent application. Further, although the invention is illustrated herein as being implemented with discrete functional building blocks, e.g., equalizers, decoders, etc., the functions of any one or more of those building blocks can be carried out using one or more appropriate programmed processors.

Finally, although shown as a predefined value, the value of the limiting number, or circular radius, can also be determined adaptively to match channel conditions or new modem standards. For example, during the training sequence of a modem handshaking process the conditions of the communications channel can be evaluated to determine the value of the circular radius.

We claim:

1. Apparatus comprising:
   means for receiving a signal, the signal comprising a plurality of received signal points, each received signal point having a location in a signal space;
   means for limiting the received signal points to a portion of the signal space by changing the locations of those ones of the plurality of received signal points whose locations are outside of said portion of the signal space; and
   means for decoding those ones of the plurality of received signal points whose locations have been changed and the remaining ones of the plurality of received signal points to provide a received data sequence.

2. The apparatus of claim 1 wherein the change in location is accomplished by moving those respective ones of the plurality of signal points closer to the origin of the signal space.

3. The apparatus of claim 1 wherein the signal is a multiple amplitude modulation signal.

4. The apparatus of claim 1 wherein the signal space comprises uniformly spaced signal points.

5. The apparatus of claim 1 wherein the signal space comprises non-uniformly spaced signal points.

6. The apparatus of claim 1 wherein the means for limiting includes:
   means for determining whether the location of each one of the plurality of received signal points is outside of said portion of the signal space; and
   means for scaling, by a factor less than one, those ones of the plurality of received signal points that are outside of said portion of the signal space in order to change their locations.

7. The apparatus of claim 6 wherein the factor is a function of the distance that each one of the respective received signal points is outside of said portion of the signal space.

8. The apparatus of claim 6 wherein each one of the plurality of received signal points is N-dimensional, N being an integer, and the factor reduces at least two of the N-dimensions of those ones of the received signal points that are outside of said portion of the signal space.

9. The apparatus of claim 8 wherein the reduction of those ones of the received signal points outside of said portion of the signal space maintains their phases.

10. The apparatus of claim 6 wherein said portion of the signal space is a circle centered about the origin of the signal space, the circle having a radius, r.

11. The apparatus of claim 10 wherein the location of each one of the plurality of received signal points is represented by a plurality of coordinates and the means for determining sums the squares of each one of the plurality of coordinates for each one of the plurality of received signal points and compares each sum to a number, the number representing the square of the radius of said circle.

12. Apparatus for use in a communications system comprising:
    means for receiving a signal, the signal comprising a plurality of received signal points, each received signal point having a location in a signal space;
    means for determining whether the location of each one of the plurality of received signal points is outside of a portion of the signal space;
    means for scaling, by a factor less than 1, those ones of the plurality of received signal points that are outside of said portion of the signal space; and
    means for decoding those ones of the plurality of received signal points that have been scaled by said factor and the remaining ones of the plurality of received signal points to provide a received data sequence.

13. The apparatus of claim 12 wherein the factor is a function of the distance that each one of the respective received signal points is outside of said portion of the signal space.

14. The apparatus of claim 13 wherein each one of the plurality of the received signal points is N-dimensional, N being an integer, and the factor reduces at least two of the N-dimensions of those ones of the received signal points that are outside of said portion of the signal space.

15. The apparatus of claim 14 wherein said portion of the signal space is Betts-Souders 44-1 a circle centered about the origin of the signal space, the circle having a radius, r.

16. The apparatus of claim 15 wherein means for determining sums the squares of each one of the N-dimensional coordinates for each one of the plurality of received signal points and compares each sum to a number, the number representing the square of the radius of said circle.

17. The apparatus of claim 12 wherein the signal space comprises uniformly spaced signal points.

18. A method for use in a communications system comprising the steps of:
    receiving a plurality of signal points, each signal point having a location in a signal space;
    determining if the location of each one of the plurality of signal points is outside of a portion of the signal space;
    translating the locations of those ones of the plurality of signal points that have been determined to be outside of said portion to be closer to the origin of said signal space; and
    decoding those ones of the plurality of signal points that have been translated and the remaining ones of the plurality of signal points to provide a stream of data.

19. The method of claim 18 wherein each one of the plurality of the signal points is N-dimensional, N being an integer, and the translating step multiplies at least two of the N-dimensional coordinates of those ones of the plurality of signal points that are outside of said portion of the signal space by a factor in order to change their location.

20. The method of claim 19 wherein the translating step maintains the phase of those ones of the plurality of signal points that are outside of said portion of the signal space.

21. The method of claim 19 wherein the factor is a function of the distance that each one of the respective signal points is outside of said portion of the signal space.

22. The method of claim 21 wherein said portion of the signal space is a circle centered about the origin of the signal space, the circle having a radius, r.

23. The method of claim 22 wherein the determining step sums the squares of each one of the N-dimensional coordinates for each one of the plurality of signal points and compares each sum to a number, the number representing the square of the radius of said circle.

* * * * *